United States Patent
Martel et al.

(10) Patent No.: US 12,093,091 B1
(45) Date of Patent: Sep. 17, 2024

(54) PROTECTIVE COVER APPARATUS FOR A DIRECT-VIEW LIGHT EMITTING DIODE (DV LED) SCREEN AND A METHOD OF PROTECTING AND MAINTAINING THE DV LED SCREEN

(71) Applicant: TSI Touch, Inc, Uniontown, PA (US)

(72) Inventors: Christopher Martel, Clinton, MA (US); Shawn Moore, Scottdale, PA (US)

(73) Assignee: TSI Touch, Inc, Uniontown, PA (US)

( * ) Notice: Subject to any disclaimer, the term of this patent is extended or adjusted under 35 U.S.C. 154(b) by 0 days.

(21) Appl. No.: 18/601,163

(22) Filed: Mar. 11, 2024

(51) Int. Cl.
*H05K 5/02* (2006.01)
*G06F 1/18* (2006.01)

(52) U.S. Cl.
CPC .......... *G06F 1/181* (2013.01); *H05K 5/0204* (2013.01)

(58) Field of Classification Search
CPC .............................. G06F 1/181; H05K 5/0204
USPC .............. 348/818; 362/125; 312/114, 138.1; 248/918; D14/448, 449, 450
See application file for complete search history.

(56) References Cited

U.S. PATENT DOCUMENTS

| | | |
|---|---|---|
| 3,811,489 A | 5/1974 | Thun et al. |
| 6,056,376 A | 5/2000 | Yenglin et al. |
| 6,469,752 B1 * | 10/2002 | Ishikawa .................. H04N 5/72 348/823 |
| 9,671,824 B2 * | 6/2017 | Mundrake ................ H04N 5/64 |
| 9,767,719 B2 | 9/2017 | Li et al. |
| 10,390,633 B2 * | 8/2019 | Artwohl .................. E05F 1/063 |
| 10,878,742 B2 * | 12/2020 | Green ....................... F21K 9/20 |
| 11,585,136 B2 * | 2/2023 | Rupp ...................... E06B 3/482 |
| 2017/0071070 A1 * | 3/2017 | Mundrake ............. G06F 1/1603 |
| 2021/0211618 A1 | 7/2021 | Silverstein et al. |
| 2023/0075171 A1 | 3/2023 | Grolman et al. |
| 2023/0375250 A1 | 11/2023 | Maluto et al. |
| 2023/0408744 A1 | 12/2023 | Li et al. |

FOREIGN PATENT DOCUMENTS

| | | |
|---|---|---|
| AU | 2003283066 A1 | 6/2004 |
| EP | 1783583 B1 | 3/2012 |

* cited by examiner

*Primary Examiner* — Anthony Q Edwards
*Assistant Examiner* — Hung Q Dang
(74) *Attorney, Agent, or Firm* — Renner, Otto, Boisselle & Sklar, LLP

(57) ABSTRACT

A protective cover apparatus for a direct-view LED (DV LED) screen is provided. The protective cover apparatus may comprise a back wall mount, a plurality of panel flex safety spacers, a front frame, a plurality of rigid DV LED protective panels, and a ventilated edge covering. The front frame may be attached to the back wall mount. The plurality of panel flex safety spacers may forwardly distance the front frame from the back wall mount by a panel flex safety clearance of at least 3 inches. The front frame may have an inner frame perimeter bounding a DV LED viewing window and an outer frame perimeter. The plurality of rigid DV LED protective panels may be rotatably mounted to the front frame. Each DV LED protective panel may have a transparent portion and a frame portion bordering the transparent portion.

17 Claims, 9 Drawing Sheets

PROTECTIVE COVER APPARATUS FOR A DIRECT-VIEW LIGHT EMITTING DIODE (DV LED) SCREEN AND A METHOD OF PROTECTING AND MAINTAINING THE DV LED SCREEN

FIELD

This document relates to a protective cover apparatus and specifically, to a protective cover apparatus for a direct-view light emitting diode (DV LED) screen and a method of protecting and maintaining the DV LED screen.

BACKGROUND

A DV LED screen includes multiple LED modules that can work together to seamlessly display content like a single screen. In contrast to typical liquid crystal displays, DV LED screens do not require backlights or edge lights. The bezel-free design of DV LED screens can enable creation of seamless video walls.

Each LED module of the DV LED screen can include an array of multiple LEDs mounted on a display panel. The modular construction of DV LED screens can provide design flexibility in shape, size, and/or aspect ratio of the screen. DV LED screens can be constructed in different sizes including, for example, sizes of 110" or more. The modular construction of DV LED screen can improve maintenance/service efficiency and/or cost by enabling repair/service of an individual malfunctioning or damaged LED module. In contrast with a conventional display, the entire DV LED screen does not need to be repaired/serviced when only one or a subset of the LED modules are malfunctioning or damaged.

SUMMARY

The following summary is provided to introduce the reader to the more detailed discussion to follow. The summary is not intended to limit or define any claimed or as yet unclaimed invention. One or more inventions may reside in any combination or sub-combination of the elements or process steps disclosed in any part of this document including its claims and figures.

According to some aspects, a protective cover apparatus for a DV LED screen is provided. The protective cover apparatus may comprise a back wall mount; a plurality of panel flex safety spacers; a front frame; a plurality of rigid DV LED protective panels; and a ventilated edge covering. The front frame may be attached to the back wall mount. The plurality of panel flex safety spacers may forwardly distance the front frame from the back wall mount by a panel flex safety clearance of at least 3 inches. The front frame may have an inner frame perimeter bounding a DV LED viewing window and an outer frame perimeter. The plurality of rigid DV LED protective panels may be rotatably mounted to the front frame. Each DV LED protective panel may have a transparent portion and a frame portion bordering the transparent portion. Each DV LED protective panel may be rotatable between a protective position in which only the transparent portion of the DV LED protective panel overlays the DV LED viewing window and a maintenance position in which the DV LED viewing window is uncovered by the DV LED protective panel. When all of the DV LED protective panels are in their respective protective positions, the transparent portions of the DV LED protective panels may collectively overlay an entirety of the DV LED viewing window. The ventilated edge covering may extend between the front frame and the back wall mount around the outer frame perimeter of the front frame.

According to some aspects, a protected DV LED screen is provided. The protected DV LED screen comprises the protective cover apparatus as described herein, and the DV LED screen positioned within the protective cover apparatus.

According to some aspects, a method of protecting and maintaining a DV LED screen having a plurality of DV LED modules is provided. The method may comprise: mounting a back wall mount around the DV LED screen; attaching a front frame to the back wall mount, the front frame having an inner frame perimeter bounding a DV LED viewing window and an outer frame perimeter, a plurality of panel flex safety spacers forwardly distancing the front frame from the back wall mount by a panel flex safety clearance of at least 3 inches, the DV LED viewing window overlaying an entirety of the plurality of DV LED modules; rotatably mounting a plurality of rigid DV LED protective panels to the front frame, each DV LED protective panel having a transparent portion and a frame portion bordering the transparent portion, each DV LED protective panel being rotatable between a protective position in which only the transparent portion of the DV LED protective panel overlays the DV LED viewing window, and a maintenance position in which the DV LED viewing window is uncovered by the DV LED protective panel, when all of the DV LED protective panels are in their respective protective positions, the transparent portions of the DV LED protective panels collectively overlay an entirety of the DV LED viewing window; installing a ventilated edge covering extending between the front frame and the back wall mount around the outer frame perimeter of the front frame; rotating at least one of the plurality of DV LED protective panels from the protective position to the maintenance position; servicing at least one of the plurality of DV LED modules; and rotating the at least one of the plurality of DV LED protective panels from the maintenance position to the protective position.

BRIEF DESCRIPTION OF THE DRAWINGS

The drawings included herewith are for illustrating various examples of articles, methods, and apparatuses of the present specification and are not intended to limit the scope of what is taught in any way. In the drawings:

FIG. 1 shows a plurality of DV LED protective panels of the protective cover apparatus in a maintenance position.

FIG. 8 shows a plurality of DV LED protective panels of the protective cover apparatus in a maintenance position.

DETAILED DESCRIPTION

Figure 1:
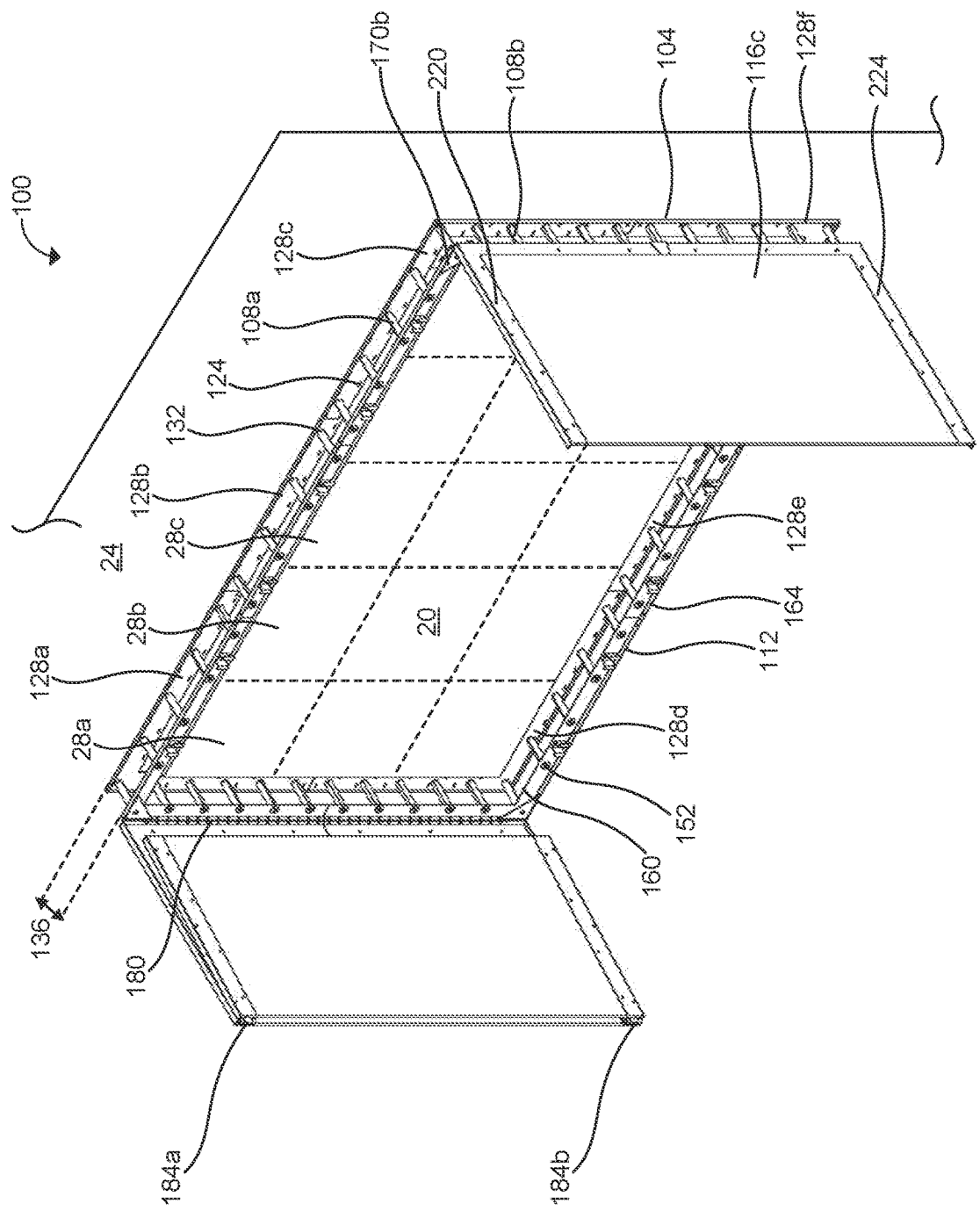
FIG. 1 is a perspective view of a protective cover apparatus protecting a DV LED screen, in accordance with an embodiment.
Figure 2:
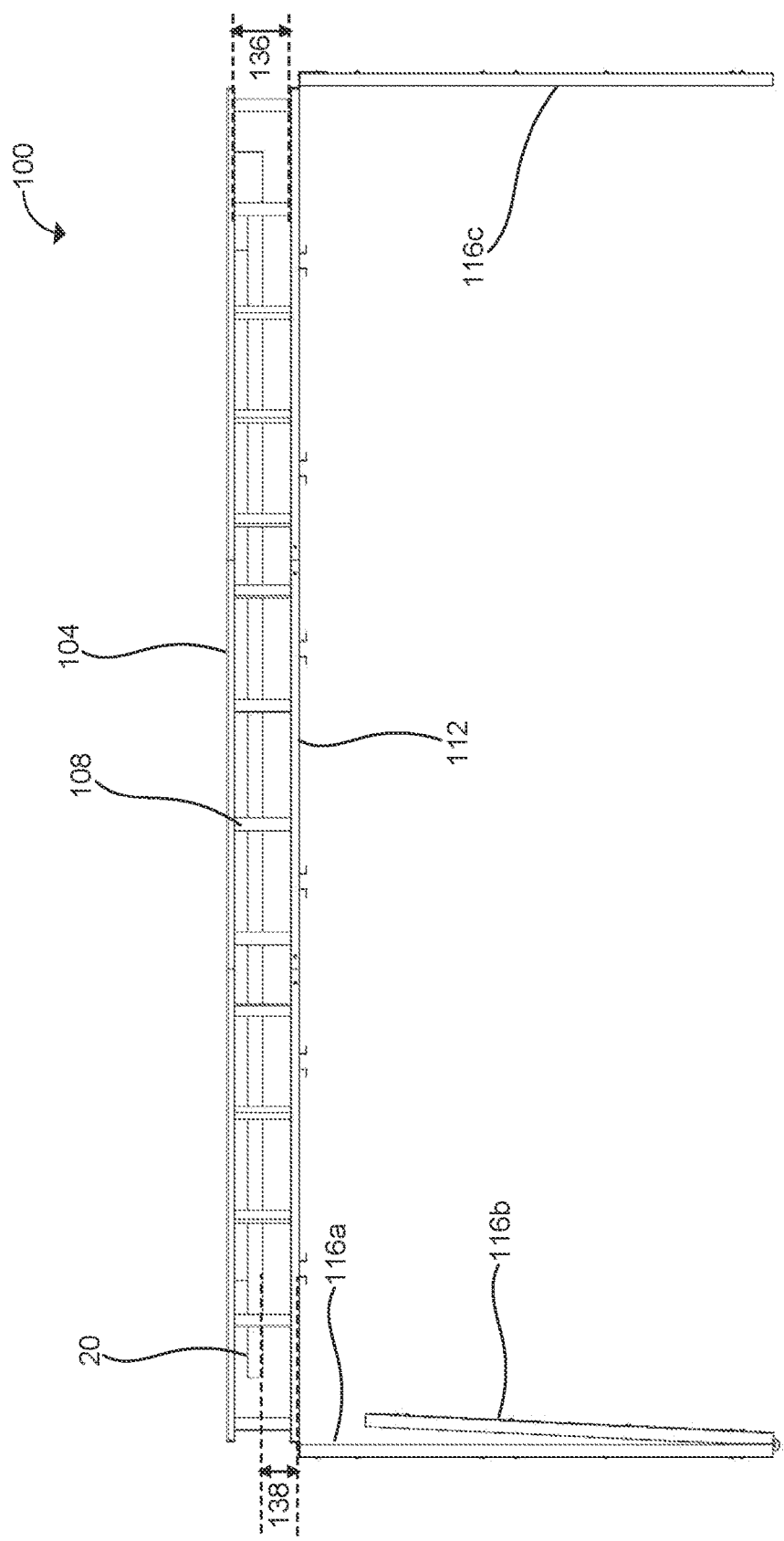
FIG. 2 is a top view of the protective cover apparatus of FIG. 1.
Figure 3:
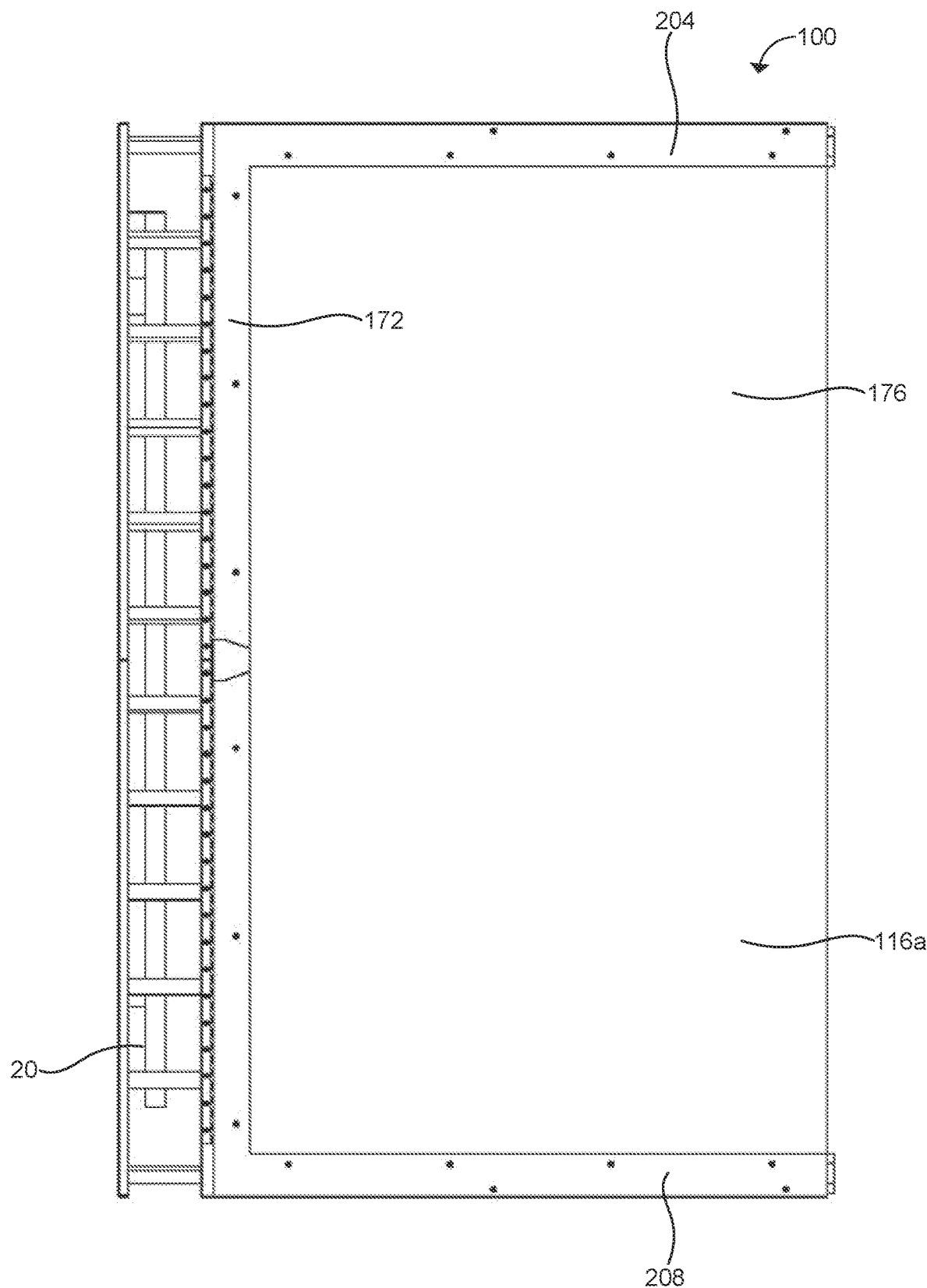
FIG. 3 is a side view of the protective cover apparatus of FIG. 1.
Figure 4:
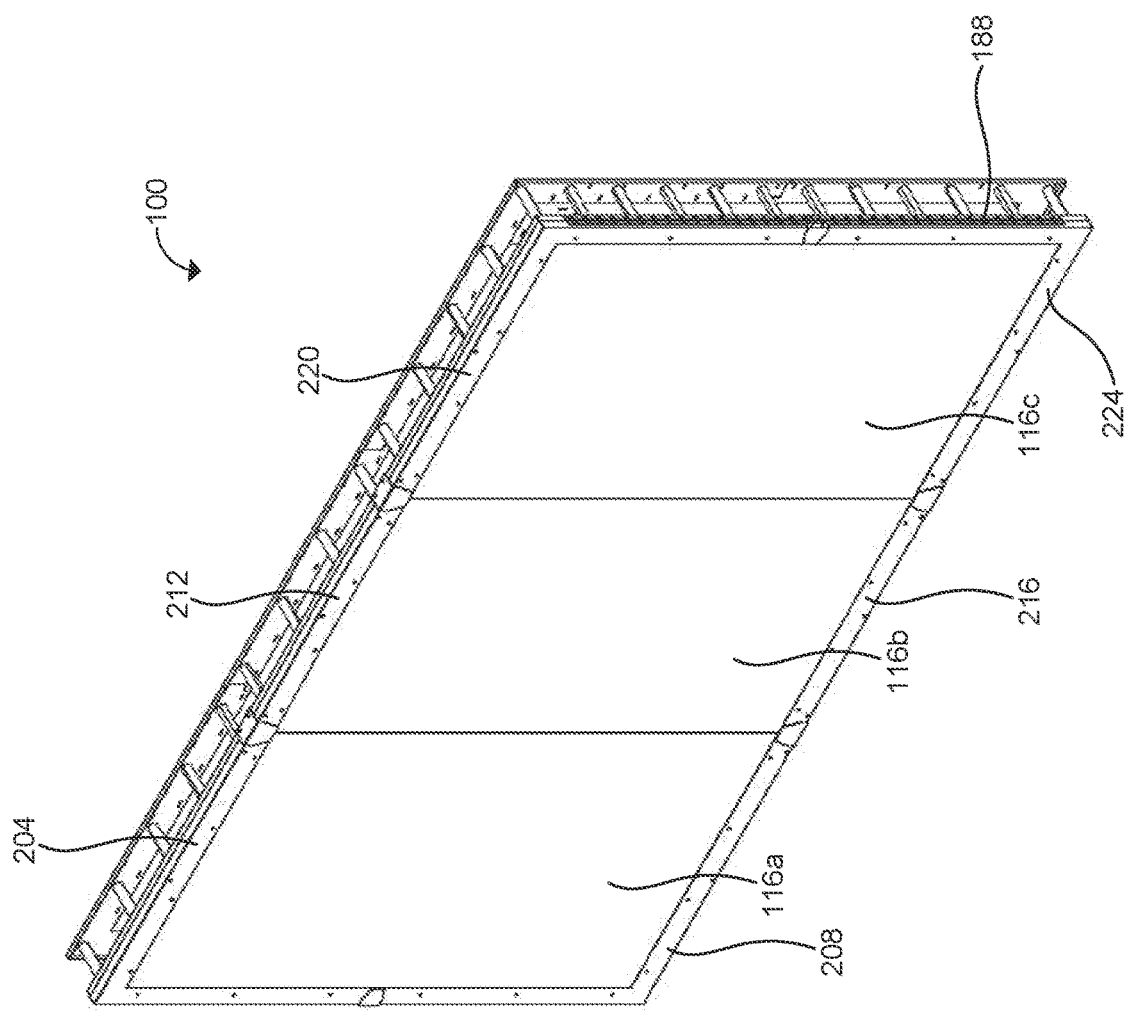
FIG. 4 is a perspective view of the protective cover apparatus of FIG. 1 with the plurality of DV LED protective panels in a protective position.
Figure 5:
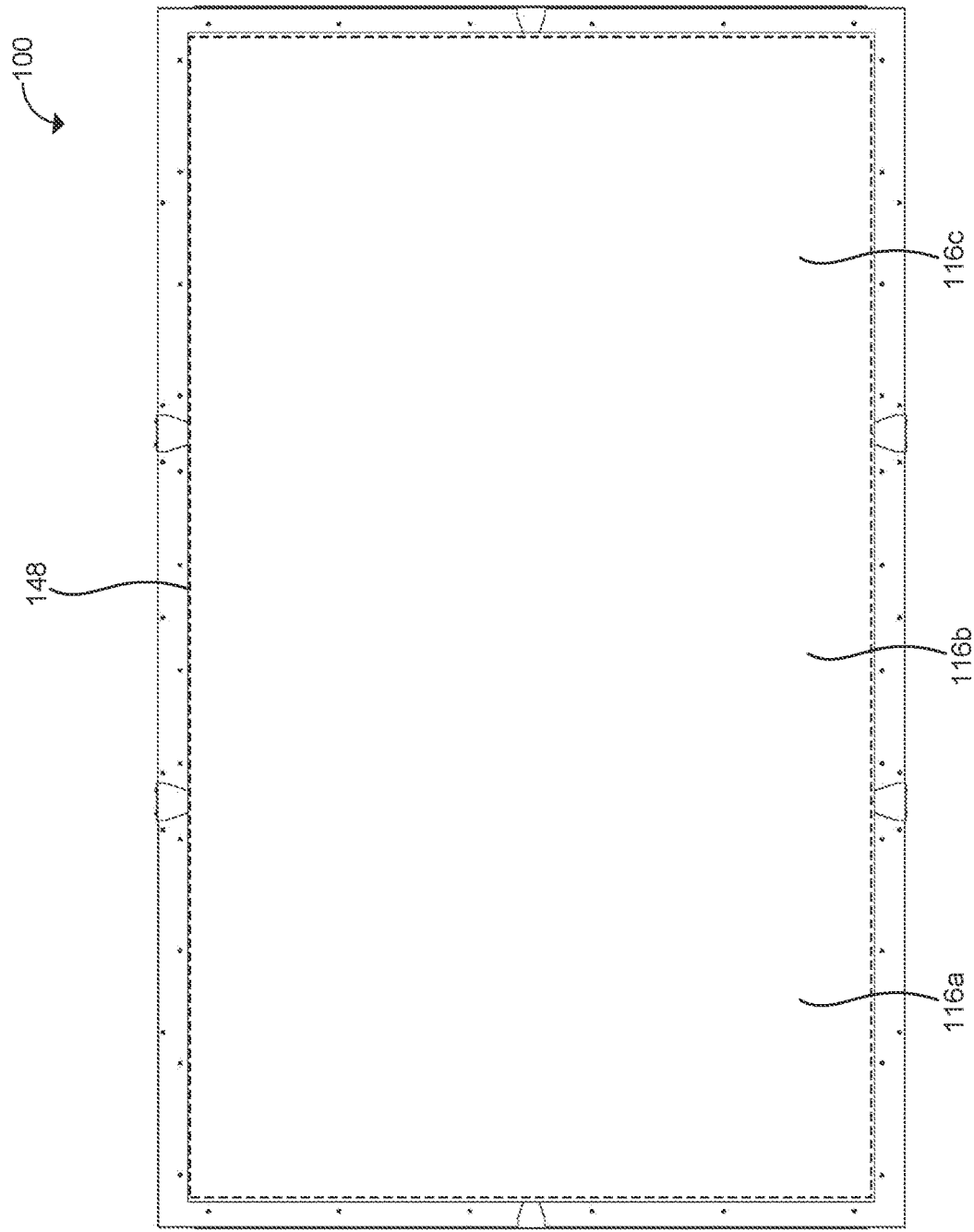
FIG. 5 is a front view of the protective cover apparatus of FIG. 4.
Figure 6:
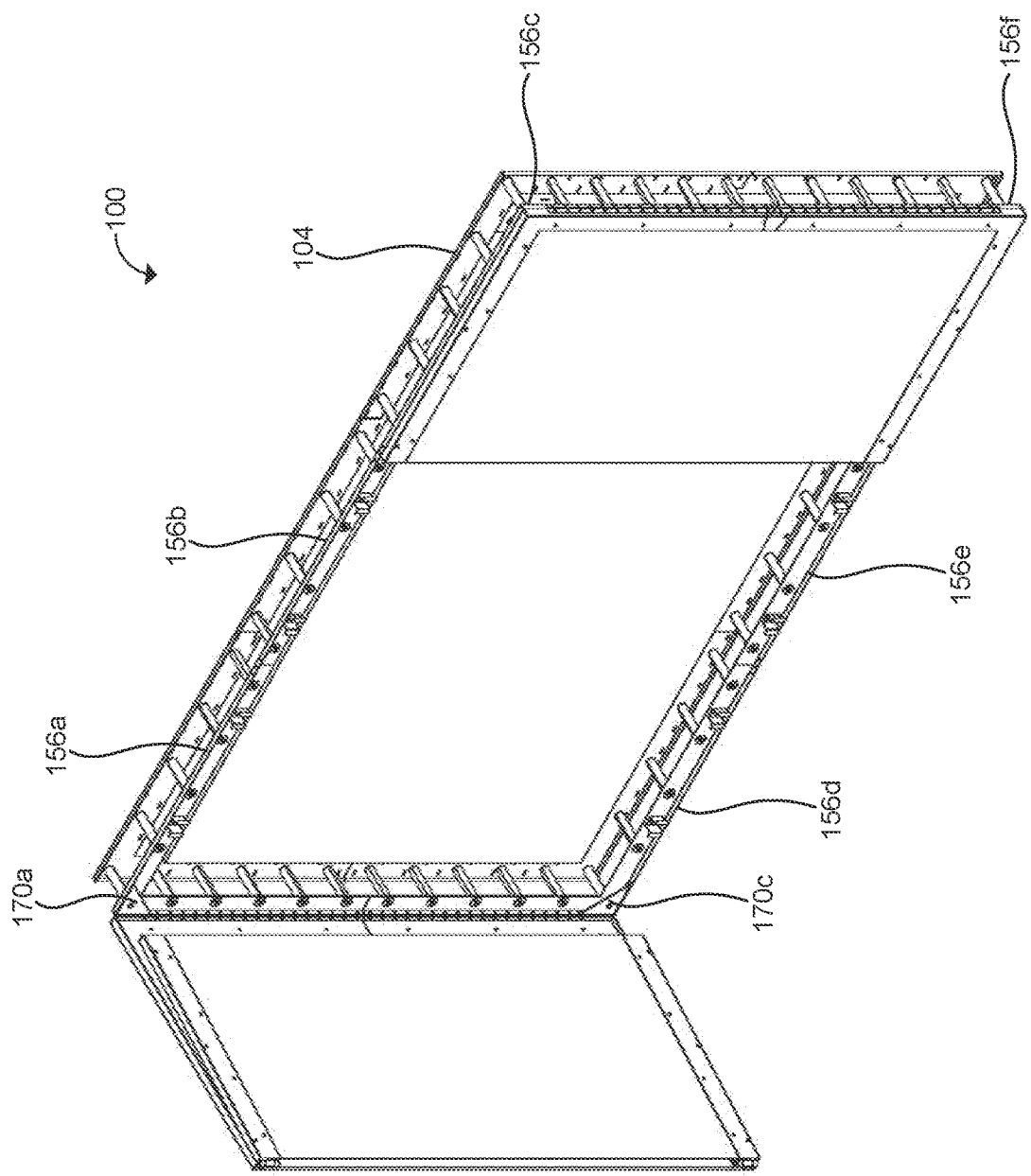
FIG. 6 is a perspective view of the protective cover apparatus of FIG. 1 with one of the plurality of DV LED protective panels in a protective position and the other DV LED protective panels in a maintenance position.

Numerous embodiments are described in this application and are presented for illustrative purposes only. The described embodiments are not intended to be limiting in any sense. The invention is widely applicable to numerous embodiments, as is readily apparent from the disclosure herein. Those skilled in the art will recognize that the present invention may be practiced with modification and alteration without departing from the teachings disclosed herein. Although particular features of the present invention may be described with reference to one or more particular embodiments or figures, it should be understood that such features are not limited to usage in the one or more particular embodiments or figures with reference to which they are described.

The terms "an embodiment," "embodiment," "embodiments," "the embodiment," "the embodiments," "one or more embodiments," "some embodiments," and "one embodiment" mean "one or more (but not all) embodiments of the present invention(s)," unless expressly specified otherwise.

The terms "including," "comprising" and variations thereof mean "including but not limited to," unless expressly specified otherwise. A listing of items does not imply that any or all of the items are mutually exclusive, unless expressly specified otherwise. The terms "a," "an" and "the" mean "one or more," unless expressly specified otherwise.

As used herein and in the claims, two or more parts are said to be "coupled", "connected", "attached", "joined", "affixed", "fastened", or "mounted" where the parts are joined or operate together either directly or indirectly (i.e., through one or more intermediate parts), so long as a link occurs. As used herein and in the claims, two or more parts are said to be "directly coupled", "directly connected", "directly attached", "directly joined", "directly affixed", "directly fastened", or "directly mounted" where the parts are connected in physical contact with each other. As used herein, two or more parts are said to be "rigidly coupled", "rigidly connected", "rigidly attached", "rigidly joined", "rigidly affixed", "rigidly fastened", or "rigidly mounted" where the parts are coupled so as to move as one while maintaining a constant orientation relative to each other. None of the terms "coupled", "connected", "attached", "joined", "affixed", "fastened" and "mounted" distinguish the manner in which two or more parts are joined together.

Further, although method steps may be described (in the disclosure and/or in the claims) in a sequential order, such methods may be configured to work in alternate orders. In other words, any sequence or order of steps that may be described does not necessarily indicate a requirement that the steps be performed in that order. The steps of methods described herein may be performed in any order that is practical. Further, some steps may be performed simultaneously.

As used herein and in the claims, a group of elements are said to 'collectively' perform an act where that act is performed by any one of the elements in the group, or performed cooperatively by two or more (or all) elements in the group.

As used herein and in the claims, a first element is said to be "received" in a second element where at least a portion of the first element is received in the second element unless specifically stated otherwise.

Some elements herein may be identified by a part number, which is composed of a base number followed by an alphabetical or subscript-numerical suffix (e.g., 112a, or 1121). Multiple elements herein may be identified by part numbers that share a base number in common and that differ by their suffixes (e.g., 1121, 1122, and 1123). All elements with a common base number may be referred to collectively or generically using the base number without a suffix (e.g., 112).

As used herein and in the claims, "up", "down", "above", "below", "upwardly", "vertical", "elevation", "upper", "lower" and similar terms are in reference to a directionality generally aligned with (e.g., parallel to) gravity. The terms "distal", "proximal" and similar terms are in reference to a directionality generally that is transverse (e.g., perpendicular) to gravity. However, none of the terms referred to in this paragraph imply any particular alignment between elements. For example, a first element may be said to be "vertically above" a second element, where the first element is at a higher elevation than the second element, and irrespective of whether the first element is vertically aligned with the second element.

The disclosed apparatus and methods can protect the DV LED screen by providing rigid DV LED protective panels that overlay the DV LED screen. The DV LED protective panels can be moved between a protection position covering the DV LED screen to a maintenance position in which the DV LED screen is uncovered to enable maintenance/service of the DV LED modules.

The DV LED protective panels may have a transparent portion to enable a viewer positioned in front of the DV LED screen to view a display provided by the DV LED screen. The transparent portion of the DV LED protective panels may be manufactured using any suitable rigid and transparent material, for example, an acrylic material. The acrylic material may flex/deform, for example, in response to an external force. The flex/deformation can cause the DV LED protective panels to contact and potentially damage the DV LED screen if sufficient clearance is not provided. The disclosed apparatus and methods can use a plurality of panel flex safety spacers to provide sufficient DV LED screen clearance between the DV LED screen surface and the DV LED protective panels to protect the DV LED screen. Furthermore, the acrylic material may be heat-sensitive. The DV LED screen clearance can reduce exposure of the acrylic material to heat generated by the DV LED screen.

Reference is now made to FIGS. 1 to 7 showing a protective cover apparatus 100 for a DV LED screen 20, in accordance with an embodiment. DV LED screen 20 may include multiple DV LED modules 28. In the illustrated embodiment, protective cover apparatus 100 includes a back wall mount 104, a plurality of panel flex safety spacers 108, a front frame 112, and a plurality of rigid DV LED protective panels 116. In some embodiments, protective cover apparatus 100 includes a ventilated edge covering 120. In other embodiments, protective cover apparatus may not include a ventilated edge covering.

Back wall mount 104 can have any design suitable for removably mounting protective cover apparatus 100 to a support structure 24 (e.g., a wall). For example, back wall mount 104 may include multiple mounting apertures 124 (e.g. through holes or slots as shown) and any suitable fasteners may be used to removably mount back wall mount 104 to wall 24. Back wall mount 104 may include additional mounting apertures 132 (e.g. through holes or slots as shown) to enable attachment of front frame 112 to back wall mount 104 through panel flex safety spacers 108.

In some embodiments, back wall mount 104 may be formed as a unitary structure. This can reduce the total number of components of protective cover apparatus 100 and may increase assembly speed. In other embodiments, back wall mount 104 may include multiple back wall brackets that may be assembled into a unitary structure or remain disconnected in use. This may enable greater design flexibility for adjusting the total size of back wall mount 104 by adjusting the total number of back wall brackets in the design. Back wall mount 104 may include any suitable number of back wall brackets (e.g. 2-50 back wall brackets 128). In the illustrated example back wall mount 104 includes six back wall brackets 128a-128f. In other examples, back wall mount 104 may include fewer or greater number of back wall brackets.

Back wall mount 104 may be manufactured using any suitable material that provides sufficient mechanical strength and rigidity. For example, back wall mount 104 may be manufactured using steel, aluminum, brass or metal alloys. In some examples, back wall mount 104 may include wood material.

Protective cover apparatus 100 can include any suitable number of panel flex safety spacers 108. The total number of panel flex safety spacers 108 may be selected based on the total size of protective cover apparatus 100. For example, the total number of panel flex safety spacers 108 may be 30-60 for protective cover apparatus 100 with a diagonal size of 136 inches. In other examples, the total number of panel flex safety spacers 108 may be smaller than 30 or greater than 60. A larger number of panel flex safety spacers 108 may provide greater assembly strength. A smaller number of panel flex safety spacers 108 may enable higher assembly speed, lower cost, and lower assembly weight. In some examples, panel flex safety spacers 108 may be substantially evenly distributed. For example, adjacent panel flex safety spacers 108 may be spaced apart by a distance of between 4 and 24 inches, such as for example a distance of 8 to 16 inches. Lower values (e.g. 4 to 8 inches) may provide greater assembly strength. Higher values (e.g. greater than 8 inches) may enable higher assembly speed, lower cost, and lower assembly weight all else being equal.

Panel flex safety spacers 108 may have any design suitable for removably attaching front frame 112 to back wall mount 104, and forwardly distancing front frame 112 from back wall mount 104 by a panel flex safety clearance 136. For example, each panel flex safety spacer 108 may comprise a post. The post may include a threaded hole that corresponds to a self-clinching threaded stud installed in a mounting aperture 132 of back wall mount 104. In other examples, panel flex safety spacer 108 may comprise other structures (e.g., hexagonal or square shaped structures).

Panel flex safety spacers 108 may be manufactured using any suitable material that provides sufficient mechanical strength and rigidity. For example, panel flex safety spacers 108 may be manufactured using steel, aluminum, brass, ceramic, metal alloys, polymer, wood, or other rigid material.

In some embodiments, the panel flex safety clearance 136 may be at least 3 inches. For example, the panel flex safety clearance 136 may be in a range from 3 to 24 inches. The panel flex safety clearance 136 may preferably be at least 5 inches. For example, the panel flex safety clearance 136 may be in a range from 5 to 24 inches. The panel flex safety clearance 136 can be controlled based on a size of panel flex safety spacers 108. Larger panel flex safety clearances 136 can be achieved using longer panel flex safety spacers 108. In some embodiments, the panel flex safety clearance 136 may be smaller than 3 inches or greater than 24 inches.

Larger values of panel flex safety clearance 136 may enable (i) accommodation of greater flex/deformation of DV LED protective panels 116 by making DV LED screen clearance 138 larger, and/or (ii) accommodation of a thicker DV LED screen 20. Larger DV LED screen clearance 138 provides higher damage protection to DV LED screen 20 by enabling greater accommodation for flex/deformation of DV LED protective panels 116. This can enable, for example, usage of larger DV LED protective panels 116 (for protection of larger DV LED screens) that can have larger flex/deformation. However, larger values of panel flex safety clearance 136 may cause portions of display provided by DV LED screen to be blocked by non-transparent portions of protective cover apparatus 100 for wider viewing angles. Smaller values of panel flex safety clearance 136 can improve display visibility at wider viewing angles.

The illustrated example includes panel flex safety spacers 108 and back wall mount 104 as separate components. This may reduce manufacturing complexity. In some examples, panel flex safety spacers 108 may be integrally formed (e.g., using a stamping process) with back wall mount 104. This may reduce the total number of components of protective cover apparatus 100 and may increase assembly speed.

Front frame 112 can have any design suitable for being removably attached to back wall mount 104 through panel flex safety spacers 108. For example, front frame 112 may include multiple mounting apertures 152 (e.g. through-holes as shown) corresponding to mounting apertures 132 of back wall mount 104. Any suitable fasteners may be used to attach front frame 112 to back wall mount 104 through panel flex safety spacers 108.

Front frame 112 may have an inner frame perimeter 160 and an outer frame perimeter 164. Inner frame perimeter 160 may bound a DV LED viewing window 148. DV LED viewing window 148 is unobstructed by front frame 112 for a viewer positioned forwardly of DV LED screen 20, allowing the viewer an unobstructed view of a display (e.g. images or video) provided by DV LED screen 20.

In some embodiments, front frame 112 may be formed as a unitary structure. This can reduce the total number of components of protective cover apparatus 100 and may increase assembly speed. In other embodiments, front frame 112 may include multiple front frame parts. This may enable greater design flexibility for adjusting the total size of front frame 112 by adjusting the total number of front frame parts in the design. Front frame 112 may include any suitable number of front frame parts. In the illustrated example front frame 112 includes six front frame parts 156a-156f. In other examples, front frame 112 may include fewer or greater number of front frame parts.

Front frame 112 may be manufactured using any suitable material that provides sufficient mechanical strength and rigidity. For example, front frame 112 may be manufactured using steel, aluminum, brass, metal alloys, polymer, wood, or other ridged material (e.g. fiber board).

In some embodiments, front frame 112 may include multiple corner braces. In the illustrated example, front frame 112 includes corner braces 170. Corner braces 170 can improve mechanical strength and/or rigidity of front frame 112.

The illustrated example includes panel flex safety spacers 108 and front frame 112 as separate components. This may reduce manufacturing complexity. In some examples, panel flex safety spacers 108 may be integrally formed (e.g., using a stamping process) with front frame 112. This may reduce the total number of components of protective cover apparatus 100 and may increase assembly speed. In some examples, back wall mount 104, panel flex safety spacers 108 and front frame 112 may be integrally formed. This may reduce the total number of components of protective cover apparatus 100 and may increase assembly speed.

Protective cover apparatus 100 may include any suitable number of DV LED protective panels 116. In some embodiments, protective cover apparatus 100 may include 2 to 24 DV LED protective panels 116, such as for example, 2 to 6 DV LED protective panels 116. A smaller number of DV LED protective panels may reduce assembly cost/complexity. In the illustrated example, protective cover apparatus 100 includes three DV LED protective panels 116a-116c. In other embodiments, protective cover apparatus 100 may include at least four DV LED protective panels 116. A larger number of DV LED protective panels 116 may provide greater design flexibility for adjusting a combined coverage area of protective apparatus 100 by selecting the total number of DV LED protective panels 116. A greater number of DV LED protective panels 116 may provide greater flexibility during repair/maintenance by enabling a smaller proportion of DV LED modules 28 to be uncovered for maintenance/service.

Each DV LED protective panel 116 may have a transparent portion 172 and a frame portion 176 bordering transparent portion 172. DV LED protective panels 116 may be manufactured using any suitable material that provides sufficient mechanical strength and rigidity. For example, frame portion 176 may be manufactured using steel, aluminum, brass, metal alloys, wood, or other ridged material (e.g. fiber board). Transparent portion 172 may be manufactured using any suitably transparent and rigid material. As used herein and in the claims, a component is said to be "transparent" where it allows at least 90% of visible light (i.e. 400 nm to 700 nm light) to pass through it. In some embodiments, transparent portion 172 may be manufactured using acrylic materials.

DV LED protective panels 116 may be movably mounted to front frame 112. DV LED protective panels 116 may be movable between a protective position and a maintenance position. For example, DV LED protective panels 116 may be rotatably mounted to front frame 112. DV LED protective panels 116 may be rotatable between a protective position and a maintenance position. As another example, DV LED protective panels 116 may be slidably mounted to front frame 112. DV LED protective panels 116 may be slidable (e.g. horizontally and/or vertically) between a protective position and a maintenance position (e.g. along suitable tracks, such as drawer slides or similar).

In the protective position, only transparent portions 172 of DV LED protective panels 116 may overlay DV LED viewing window 148. Frame portions 176 of DV LED protective panels 116 may not overlay DV LED viewing window 148 to prevent blocking a viewer positioned forwardly of DV LED screen 20 from viewing a display provided by DV LED screen 20. When all of the DV LED protective panels 116 are in their respective protective positions, transparent portions 172 of DV LED protective panels 116 collectively overlay an entirety of DV LED viewing window 148 (see e.g., FIG. 5). In the maintenance position, DV LED protective panels 116 can be located outside of a forward projection of DV LED viewing window 148 so that DV LED viewing window 148 is uncovered by DV LED protective panels 116.

Any suitable mechanism may be used to mount DV LED protective panels 116 to front frame 112. For example, a plurality of hinges may be used to rotatably mount DV LED protective panels 116 to front frame 112. Frame portion 176a of a first DV LED protective panel 116a may be connected to front frame 112 by a first hinge 180. Any suitable hinge design may be used. For example, first hinge 180 can be a piano hinge. When first DV LED protective panel 116a is in the protective position, DV LED viewing window 148 can be uncovered by first hinge 180. This can provide unblocked viewing of a display on DV LED screen 20 for a viewer positioned forwardly of DV LED screen 20.

A second DV LED protective panel 116b may be rotatably mounted to first DV LED protective panel 116a. Frame portion 176b of second DV LED protective panel 116b may be connected to frame portion 176a of first DV LED protective panel 116a by one or more second hinges 184. When second DV LED protective panel 116b is in the protective position, DV LED viewing window 148 can be uncovered by second hinges 184. This can provide unblocked viewing of a display on DV LED screen 20 for a viewer positioned forwardly of DV LED screen 20.

Any suitable design may be used for second hinges 184. For example, second hinges 184 can be a bi-fold hinge. In some embodiments, second hinges 184 may include an upper second hinge 184a and a lower second hinge 184b. Upper second hinge 184a can connect an upper frame portion 204 of first DV LED protective panel 116a to an upper frame portion 212 of second DV LED protective panel 116b. Lower second hinge 184b can connect a lower frame portion 208 of first DV LED protective panel 116a to a lower frame portion 216 of second DV LED protective panel 116b.

A third DV LED protective panel 116c may be rotatably mounted to front frame 112 by a third hinge 188. Any suitable hinge design may be used. For example, third hinge 188 can be a piano hinge. When third DV LED protective panel 116c is in the protective position, DV LED viewing window 148 can be uncovered by third hinge 188. This can provide unblocked viewing of a display on DV LED screen 20 for a viewer positioned forwardly of DV LED screen 20.

Figure 8:
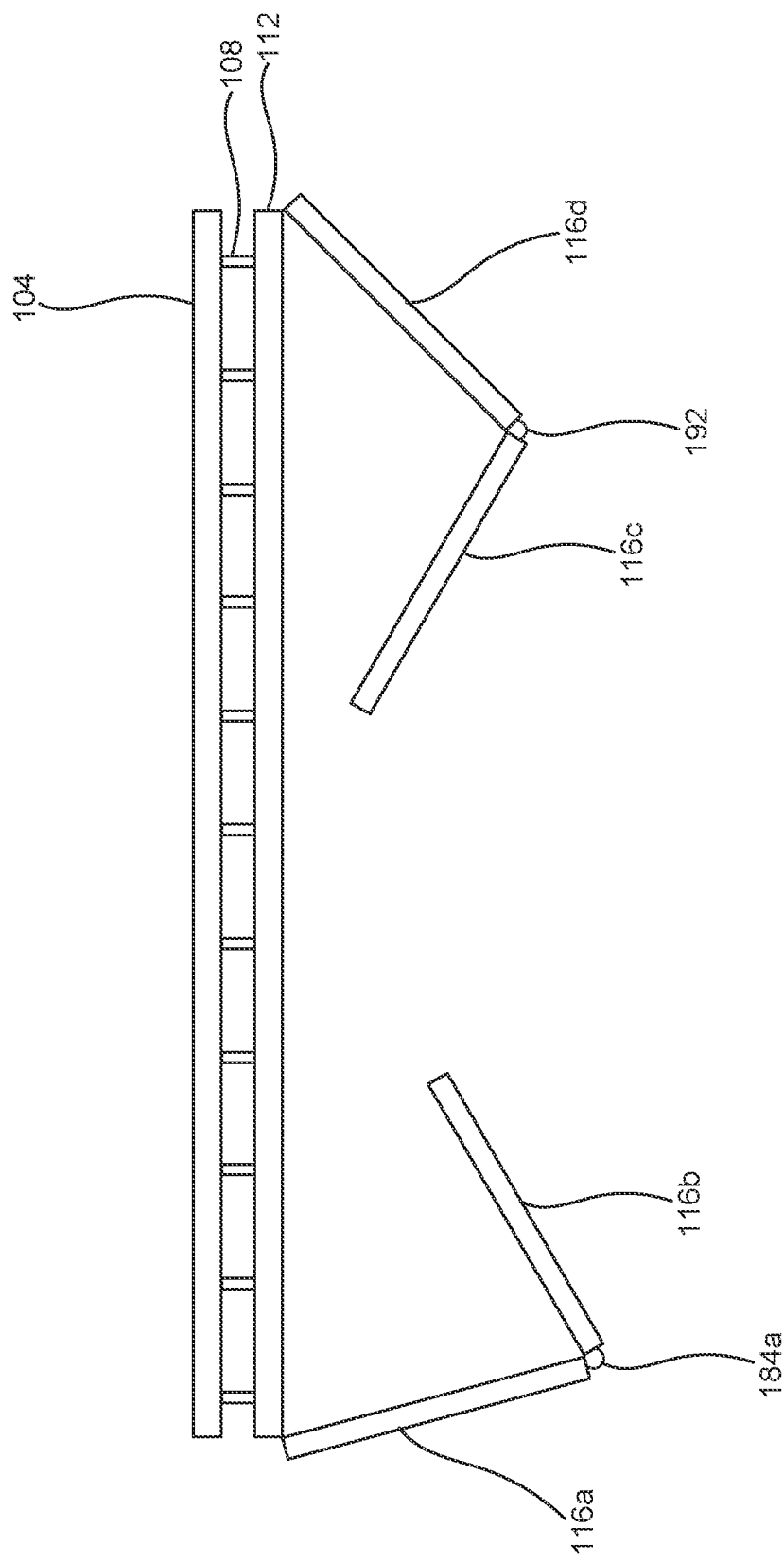
FIG. 8 is a top view schematic of a protective cover apparatus for a DV LED screen, in accordance with another embodiment.

Reference is now made to FIG. 8. FIG. 8 is a top view schematic of a protective cover apparatus for a DV LED screen, in accordance with another embodiment. FIG. 8 shows DV LED protective panels 116a-116d of protective cover apparatus 100 in a maintenance position. A fourth DV LED protective panel 116d may be rotatably mounted to third DV LED protective panel 116c. The frame portion of fourth DV LED protective panel 116d may be connected to the frame portion of third DV LED protective panel 116c by one or more fourth hinges 192. Any suitable design may be used for fourth hinges 192. For example, fourth hinges 192 can be a bi-fold hinge. When fourth DV LED protective panel 116d is in the protective position, DV LED viewing window 148 can be uncovered by fourth hinges 192. This can provide unblocked viewing of a display on DV LED screen 20 for a viewer positioned forwardly of DV LED screen 20.

Figure 7:
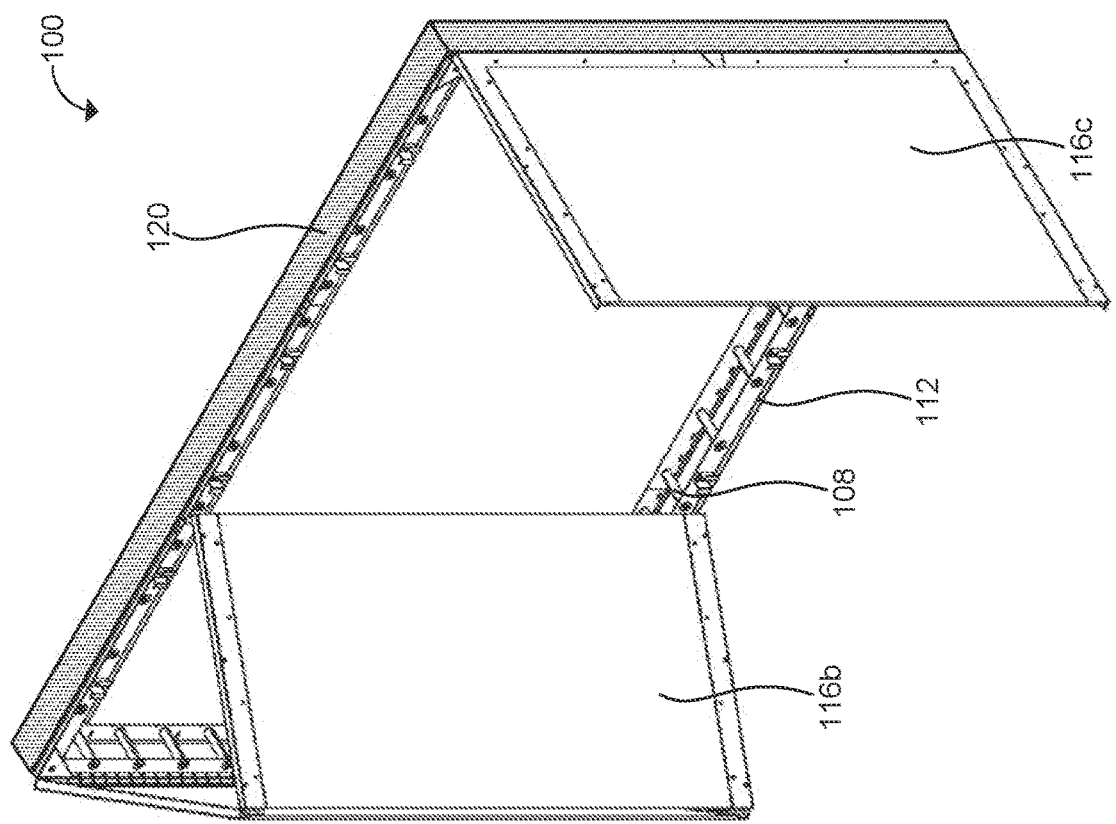
FIG. 7 is a perspective view of the protective cover apparatus of FIG. 1 with the plurality of DV LED protective panels in another maintenance position.

Ventilated edge covering 120 may have any design suitable to cover clearance distance between back wall mount 104 and front frame 112. For example, FIG. 7 shows ventilated edge covering 120 extending between front frame 112 and back wall mount 104 around outer frame perimeter 164 of front frame 112. Ventilated edge covering 120 may be made using any suitable material to provide dust protection while providing ventilation for cooling (e.g. allow hot air to escape). For example, ventilated edge covering 120 may be made using an air permeable fabric material (e.g. mesh screen) or a perforated rigid material (e.g. perforated metal plates). In some cases, ventilated edge covering 120 may have an open area percentage (total perforated area÷total area×100%) of at least 20%. A higher open area percentage may provide lower resistance to air flow. Alternatively or in addition to an open area percentage of at least 20%, ventilated edge covering 120 may have an average perforation diameter of less than 1 cm. A lower average perforation diameter may help impede the passage of fine dirt and debris. For clarity, some fabric materials may be air permeable but not have identifiable perforations and therefore no open area percentage. In some embodiments, ventilated edge covering may be liquid pervious and gas impervious. This may permit ventilated edge covering to provide, e.g. splash and rain protection.

Figure 9:
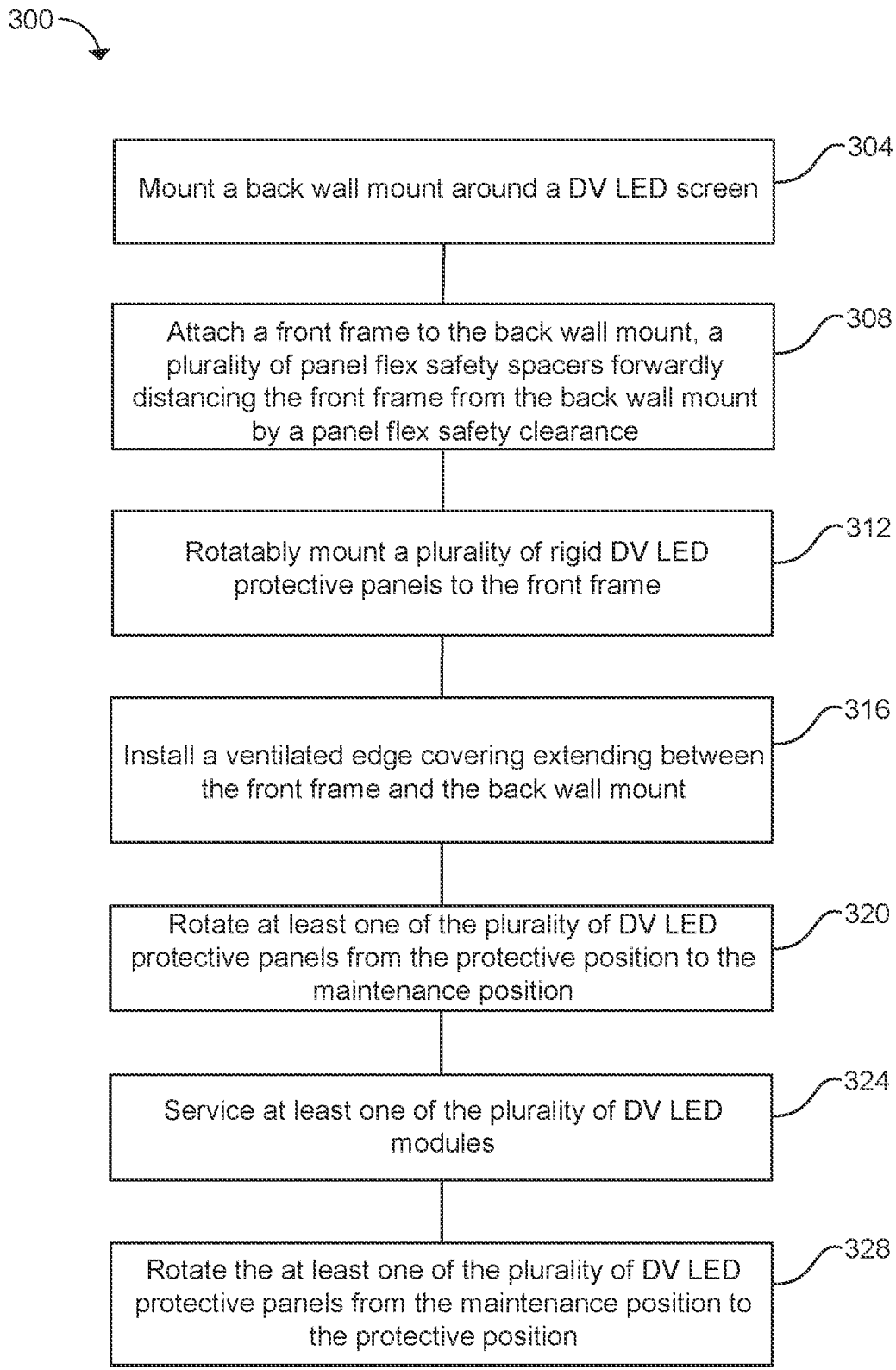
FIG. 9 is a flowchart illustrating a method of protecting and maintaining a DV LED screen having a plurality of DV LED modules, in accordance with an embodiment.

Referring now to FIG. 9, shown therein is a flowchart illustrating an example method 300 of protecting and maintaining a DV LED screen having a plurality of DV LED modules. Method 300 may be performed, for example, using protective cover apparatus 100 and reference is also made below to FIGS. 1 to 8 showing apparatus 100 and DV LED screen 20.

At step 304, a back wall mount (e.g., back wall mount 104) may be mounted around the DV LED screen (e.g., DV LED screen 20). In some examples, the back wall mount may be mounted first and the DV LED screen may be positioned later. In some cases, the DV LED screen 20 may be mounted to the back wall mount 104.

At step 308, a front frame (e.g., front frame 112) may be attached to the back wall mount. For example, the front frame may be attached to the ball wall mount through a plurality of panel flex safety spacers forwardly distancing the front frame from the back wall mount by a panel flex safety clearance of at least 3 inches. The front frame may have an inner frame perimeter (e.g., inner frame perimeter 160) bounding a DV LED viewing window (e.g., DV LED viewing window 148) and an outer frame perimeter (e.g., outer frame perimeter 164). The DV LED viewing window may overlay an entirety of the plurality of DV LED modules of the DV LED screen. For clarity, it is noted that step 308 may be performed before step 304.

At step 312, a plurality of rigid DV LED protective panels (e.g., DV LED protective panels 116) may be mounted to the front frame. Each DV LED protective panel may have a transparent portion (e.g., transparent portion 172) and a frame portion (e.g., frame portion 176) bordering the transparent portion. Each DV LED protective panel may be rotatable between a protective position in which only the transparent portion of the DV LED protective panel overlays the DV LED viewing window, and a maintenance position in which the DV LED viewing window is uncovered by the DV LED protective panel. When all of the DV LED protective panels are in their respective protective positions, the transparent portions of the DV LED protective panels can collectively overlay an entirety of the DV LED viewing window.

At step 316, a ventilated edge covering (e.g., ventilated edge covering 120) may be installed extending between the front frame and the back wall mount around the outer frame perimeter of the front frame. For clarity, it is noted that step 308 may be performed before step 312.

At step 320, at least one of the plurality of DV LED protective panels may be rotated from an initial protective position to the maintenance position. The maintenance position can enable access to one or more of the DV LED modules.

At step 324, at least one of the DV LED modules (that the maintenance position provides access to) may be serviced. The method may proceed to step 328 after the service is completed.

At step 328, the at least one of the plurality of DV LED protective panels may be rotated from the maintenance position to the protective position.

While the above description provides examples of the embodiments, it will be appreciated that some features and/or functions of the described embodiments are susceptible to modification without departing from the spirit and principles of operation of the described embodiments. Accordingly, what has been described above has been intended to be illustrative of the invention and non-limiting and it will be understood by persons skilled in the art that other variants and modifications may be made without departing from the scope of the invention as defined in the claims appended hereto. The scope of the claims should not be limited by the preferred embodiments and examples, but should be given the broadest interpretation consistent with the description as a whole.

ITEMS

Item 1: A protective cover apparatus for a direct-view LED (DV LED) screen, the protective cover apparatus comprising: a back wall mount; a plurality of panel flex safety spacers; a front frame attached to the back wall mount, the plurality of panel flex safety spacers forwardly distancing the front frame from the back wall mount by a panel flex safety clearance of at least 3 inches, the front frame having an inner frame perimeter bounding a DV LED viewing window and an outer frame perimeter; a plurality of rigid DV LED protective panels rotatably mounted to the front frame, each DV LED protective panel having a transparent portion and a frame portion bordering the transparent portion, each DV LED protective panel being rotatable between a protective position in which only the transparent portion of the DV LED protective panel overlays the DV LED viewing window, and a maintenance position in which the DV LED viewing window is uncovered by the DV LED protective panel, when all of the DV LED protective panels are in their respective protective positions, the transparent portions of the DV LED protective panels collectively overlay an entirety of the DV LED viewing window; and a ventilated edge covering extending between the front frame and the back wall mount around the outer frame perimeter of the front frame.

Item 2: The apparatus of any preceding item, wherein the plurality of rigid DV LED protective panels comprises an acrylic material.

Item 3: The apparatus of any preceding item further comprising a plurality of hinges, each hinge being connected to at least one of the plurality of rigid DV LED protective panels and the DV LED viewing window being uncovered by each of the plurality of hinges when the plurality of rigid DV LED protective panels are in the protective position.

Item 4: The apparatus of any preceding item, wherein the frame portion of a first DV LED protective panel of the plurality of rigid DV LED protective panels is connected to the front frame by a first hinge, the DV LED viewing window being uncovered by the first hinge when the first DV LED protective panel is in the protective position.

Item 5: The apparatus of any preceding item, wherein the first hinge comprises a piano hinge.

Item 6: The apparatus of any preceding item, wherein the frame portion of a second DV LED protective panel of the plurality of rigid DV LED protective panels is connected to the frame portion of the first DV LED protective panel by one or more second hinges, the DV LED viewing window being uncovered by each of the one or more second hinges when the second DV LED protective panel is in the protective position.

Item 7: The apparatus of any preceding item, wherein the one or more second hinges comprises a bi-fold hinge.

Item 8: The apparatus of any preceding item, wherein the one or more second hinges comprises: an upper second hinge connecting respective upper portions of the frame portion of the first DV LED protective panel and the frame portion of the second DV LED protective panel; and a lower second hinge connecting respective lower portions of the frame portion of the first DV LED protective panel and the frame portion of the second DV LED protective panel.

Item 9: The apparatus of any preceding item, wherein the frame portion of a third DV LED protective panel of the plurality of rigid DV LED protective panels is connected to the front frame by a third hinge, the DV LED viewing window being uncovered by the third hinge when the third DV LED protective panel is in the protective position.

Item 10: The apparatus of any preceding item, wherein the third hinge comprises a piano hinge.

Item 11: The apparatus of any preceding item, wherein the frame portion of a fourth DV LED protective panel of the plurality of rigid DV LED protective panels is connected to the frame portion of the third DV LED protective panel by one or more fourth hinges, the DV LED viewing window being uncovered by each of the one or more fourth hinges when the fourth DV LED protective panel is in the protective position.

Item 12: The apparatus of any preceding item, wherein the one or more fourth hinges comprises a bi-fold hinge.

Item 13: The apparatus of any preceding item, wherein the one or more fourth hinges comprises: an upper fourth hinge connecting respective upper portions of the frame portion of the third DV LED protective panel and the frame portion of the fourth DV LED protective panel; and a lower fourth hinge connecting respective lower portions of the frame portion of the third DV LED protective panel and the frame portion of the fourth DV LED protective panel.

Item 14: The apparatus of any preceding item, wherein each of the plurality of panel flex safety spacers comprises a post.

Item 15: The apparatus of any preceding item, wherein the plurality of panel flex safety spacers are sized to provide the panel flex safety clearance in a range from 3 to 24 inches.

Item 16: A protected direct-view LED (DV LED) screen comprising: the protective cover apparatus of item 1, and the DV LED screen positioned within the protective cover apparatus.

Item 17: A method of protecting and maintaining a direct-view LED (DV LED) screen having a plurality of DV LED modules, the method comprising: mounting a back wall mount around the DV LED screen; attaching a front frame to the back wall mount, the front frame having an inner frame perimeter bounding a DV LED viewing window and an outer frame perimeter, a plurality of panel flex safety spacers forwardly distancing the front frame from the back wall mount by a panel flex safety clearance of at least 3 inches, the DV LED viewing window overlaying an entirety of the plurality of DV LED modules; rotatably mounting a plurality of rigid DV LED protective panels to the front frame, each DV LED protective panel having a transparent portion and a frame portion bordering the transparent portion, each DV LED protective panel being rotatable between a protective position in which only the transparent portion of the DV LED protective panel overlays the DV LED viewing window, and a maintenance position in which the DV LED viewing window is uncovered by the DV LED protective panel, when all of the DV LED protective panels are in their respective protective positions, the transparent portions of the DV LED protective panels collectively overlay an entirety of the DV LED viewing window; installing a ventilated edge covering extending between the front frame and the back wall mount around the outer frame perimeter of the front frame; rotating at least one of the plurality of DV LED protective panels from the protective position to the maintenance position; servicing at least one of the plurality of DV LED modules; and rotating the at least one of the plurality of DV LED protective panels from the maintenance position to the protective position.

We claim:

1. A protective cover apparatus for a direct-view LED (DV LED) screen, the protective cover apparatus comprising:
   a back wall mount;
   a plurality of panel flex safety spacers;
   a front frame attached to the back wall mount, the plurality of panel flex safety spacers forwardly distancing the front frame from the back wall mount by a panel flex safety clearance of at least 3 inches, the front frame having an inner frame perimeter bounding a DV LED viewing window and an outer frame perimeter;
   a plurality of rigid DV LED protective panels rotatably mounted to the front frame,
      each DV LED protective panel having a transparent portion and a frame portion bordering the transparent portion,
      each DV LED protective panel being rotatable between a protective position in which only the transparent portion of the DV LED protective panel overlays the DV LED viewing window, and a maintenance position in which the DV LED viewing window is uncovered by the DV LED protective panel,
      when all of the DV LED protective panels are in their respective protective positions, the transparent portions of the DV LED protective panels collectively overlay an entirety of the DV LED viewing window; and
   a ventilated edge covering extending between the front frame and the back wall mount around the outer frame perimeter of the front frame.

2. The apparatus of claim 1, wherein the plurality of rigid DV LED protective panels comprises an acrylic material.

3. The apparatus of claim 1 further comprising a plurality of hinges, each hinge being connected to at least one of the plurality of rigid DV LED protective panels and the DV LED viewing window being uncovered by each of the plurality of hinges when the plurality of rigid DV LED protective panels are in the protective position.

4. The apparatus of claim 1, wherein the frame portion of a first DV LED protective panel of the plurality of rigid DV LED protective panels is connected to the front frame by a first hinge, the DV LED viewing window being uncovered by the first hinge when the first DV LED protective panel is in the protective position.

5. The apparatus of claim 4, wherein the first hinge comprises a piano hinge.

6. The apparatus of claim 4, wherein the frame portion of a second DV LED protective panel of the plurality of rigid DV LED protective panels is connected to the frame portion of the first DV LED protective panel by one or more second hinges, the DV LED viewing window being uncovered by each of the one or more second hinges when the second DV LED protective panel is in the protective position.

7. The apparatus of claim 6, wherein the one or more second hinges comprises a bi-fold hinge.

8. The apparatus of claim 6, wherein the one or more second hinges comprises:
- an upper second hinge connecting respective upper portions of the frame portion of the first DV LED protective panel and the frame portion of the second DV LED protective panel; and
- a lower second hinge connecting respective lower portions of the frame portion of the first DV LED protective panel and the frame portion of the second DV LED protective panel.

9. The apparatus of claim 6, wherein the frame portion of a third DV LED protective panel of the plurality of rigid DV LED protective panels is connected to the front frame by a third hinge, the DV LED viewing window being uncovered by the third hinge when the third DV LED protective panel is in the protective position.

10. The apparatus of claim 9, wherein the third hinge comprises a piano hinge.

11. The apparatus of claim 9, wherein the frame portion of a fourth DV LED protective panel of the plurality of rigid DV LED protective panels is connected to the frame portion of the third DV LED protective panel by one or more fourth hinges, the DV LED viewing window being uncovered by each of the one or more fourth hinges when the fourth DV LED protective panel is in the protective position.

12. The apparatus of claim 11, wherein the one or more fourth hinges comprises a bi-fold hinge.

13. The apparatus of claim 11, wherein the one or more fourth hinges comprises:
- an upper fourth hinge connecting respective upper portions of the frame portion of the third DV LED protective panel and the frame portion of the fourth DV LED protective panel; and
- a lower fourth hinge connecting respective lower portions of the frame portion of the third DV LED protective panel and the frame portion of the fourth DV LED protective panel.

14. The apparatus of claim 1, wherein each of the plurality of panel flex safety spacers comprises a post.

15. The apparatus of claim 1, wherein the plurality of panel flex safety spacers are sized to provide the panel flex safety clearance in a range from 3 to 24 inches.

16. A protected direct-view LED (DV LED) screen comprising:
- the protective cover apparatus of claim 1, and
- the DV LED screen positioned within the protective cover apparatus.

17. A method of protecting and maintaining a direct-view LED (DV LED) screen having a plurality of DV LED modules, the method comprising:
- mounting a back wall mount around the DV LED screen;
- attaching a front frame to the back wall mount,
  - the front frame having an inner frame perimeter bounding a DV LED viewing window and an outer frame perimeter,
  - a plurality of panel flex safety spacers forwardly distancing the front frame from the back wall mount by a panel flex safety clearance of at least 3 inches,
  - the DV LED viewing window overlaying an entirety of the plurality of DV LED modules;
- rotatably mounting a plurality of rigid DV LED protective panels to the front frame,
  - each DV LED protective panel having a transparent portion and a frame portion bordering the transparent portion,
  - each DV LED protective panel being rotatable between a protective position in which only the transparent portion of the DV LED protective panel overlays the DV LED viewing window, and a maintenance position in which the DV LED viewing window is uncovered by the DV LED protective panel,
  - when all of the DV LED protective panels are in their respective protective positions, the transparent portions of the DV LED protective panels collectively overlay an entirety of the DV LED viewing window;
- installing a ventilated edge covering extending between the front frame and the back wall mount around the outer frame perimeter of the front frame;
- rotating at least one of the plurality of DV LED protective panels from the protective position to the maintenance position;
- servicing at least one of the plurality of DV LED modules; and
- rotating the at least one of the plurality of DV LED protective panels from the maintenance position to the protective position.

\* \* \* \* \*